United States Patent [19]

Gutman et al.

[11] Patent Number: 5,378,405
[45] Date of Patent: Jan. 3, 1995

[54] CONDUCTIVE MICROPARTICLES AND PRESSURE-SENSITIVE ADHESIVE TAPES MADE THEREFROM

[75] Inventors: Gustav Gutman, Austin, Tex.; Richard J. Goetz, Woodbury, Minn.

[73] Assignee: Minnesota Mining and Manufacturing Company, St. Paul, Minn.

[21] Appl. No.: 98,166

[22] Filed: Jul. 28, 1993

[51] Int. Cl.$^6$ .......................... H01B 1/12; B32B 7/12
[52] U.S. Cl. ....................... 252/62; 252/518; 428/355; 428/402; 521/56; 523/223; 524/801
[58] Field of Search ............... 428/355, 356, 402; 521/56, 60, 63, 64, 149; 523/223; 524/801; 252/506, 509, 500, 518

[56] References Cited

U.S. PATENT DOCUMENTS

| | | | |
|---|---|---|---|
| 3,104,985 | 9/1963 | Williams et al. | 117/256 |
| 3,497,383 | 2/1970 | Olyphant, Jr.; et al. | 117/212 |
| 3,691,140 | 9/1972 | Silver | 260/78.5 |
| 4,098,945 | 7/1978 | Oehmke | 428/327 |
| 4,166,152 | 8/1979 | Baker et al. | 428/522 |
| 4,471,037 | 9/1984 | Bannister | 429/191 |
| 4,548,862 | 10/1985 | Hartman | 428/323 |
| 4,636,432 | 1/1987 | Shibano et al. | 428/327 |
| 4,656,218 | 4/1987 | Kinoshita | 524/460 |
| 4,749,612 | 6/1988 | Borkowski et al. | 528/246 |
| 4,968,562 | 11/1990 | Delgado | 428/402 |
| 4,988,567 | 1/1991 | Delgado | 428/402 |
| 4,994,322 | 2/1991 | Delgado et al. | 428/355 X |
| 5,045,569 | 9/1991 | Delgado | 521/60 |
| 5,118,750 | 6/1992 | Silver et al. | 524/462 |
| 5,162,174 | 11/1992 | Andrei et al. | 429/192 |
| 5,215,818 | 6/1993 | Silver et al. | 428/344 X |
| 5,219,900 | 6/1993 | Davies et al. | 523/201 |
| 5,240,761 | 8/1993 | Calhoun et al. | 428/343 X |
| 5,266,402 | 11/1993 | Delgado et al. | 428/355 |

FOREIGN PATENT DOCUMENTS

| | | | |
|---|---|---|---|
| 276691A | 1/1988 | European Pat. Off. | . |
| 0276691B1 | 1/1988 | European Pat. Off. | C09J 133/2 |
| 0399441A2 | 5/1990 | European Pat. Off. | C09D 4/00 |
| 0422919A2 | 10/1990 | European Pat. Off. | C09J 7/02 |
| 0508722A1 | 4/1992 | European Pat. Off. | H01B 1/22 |
| 2568574 | 2/1986 | France | . |
| 61-272279 | 12/1986 | Japan | . |
| 63-012681 | 1/1988 | Japan | . |
| WO9210553 | 6/1992 | WIPO | . |

OTHER PUBLICATIONS

U. S. Pat. No. 07/989,101, Dec. 10, 1992, Delgado.

*Primary Examiner*—Daniel R. Zirker
*Attorney, Agent, or Firm*—Gary L. Griswold; Walter N. Kirn; Darla P. Neaveill

[57] ABSTRACT

Conductive, polymeric, inherently tacky, solvent-insoluble, solvent-dispersible, elastomeric, pressure-sensitive adhesive microparticles having an average diameter of at least about 1 micrometer, said microparticles having an ionic conductive material present on said surface, and anti-static pressure-sensitive adhesive tapes made therefrom.

20 Claims, No Drawings

CONDUCTIVE MICROPARTICLES AND PRESSURE-SENSITIVE ADHESIVE TAPES MADE THEREFROM

BACKGROUND OF THE INVENTION

1. Field of the Invention

The invention relates to generally spherical, conductive, inherently tacky, elastomeric, solvent-dispersible, solvent-insoluble polymeric microparticles which may be used in applications requiring electrical conductivity or elimination of electrostatic charge. The ionically conductive polymeric microparticles may be included in adhesive formulations which provide adhesive tapes with a remarkable capacity for preventing static charge build-up.

2. Description of the Art

Antistatic adhesive compositions are useful for attaching surface-mount components at points on printed circuit boards where they are to be conductively attached e.g., by soldering. Antistatic adhesives, when coated on selected substrates and suitably converted, provide antistatic, pressure-sensitive adhesive tapes. The tapes are useful for masking printed circuit boards prior to wave soldering and the like.

A number of methods are known for preparing antistatic adhesive compositions. One common method is the addition of conductive moieties to conventional adhesive formulations. Antistatic species may be introduced as conductive materials such as electrically conductive metal or carbon particles. Compositions of this type are disclosed in prior art references including EP 0276691A, EP 0518722A, U.S. Pat. No. 4,606,962, EP 0422919A, U.S. Pat. Nos. 3,104,985, 4,749,612 and 4,548,862.

The addition of ionic materials to reduce generation of static charge is also known. Suitable materials of this type include ion conducting species such as those disclosed in Japanese patents JP 61,272,279 and JP 63,012,681.

U.S. Pat. No. 4,098,945 discloses a conductive composition which comprises a polymeric binder system, a plurality of insoluble spherical domains dispersed in the system, and at least one electrically conductive filler dispersed in the binder which provides conductive pathways through the composition. The spherical domains are preferably adhesive microspheres, the use of which lessens the amount of conductive filler used.

Yet another type of antistatic tape material is provided using a metal foil tape backing. One example of this, disclosed in U.S. Pat. No. 3,497,383, provides embossed foil tapes where contact points of metal project from the surface of the adhesive.

Several problems are encountered with known antistatic adhesive compositions. Compositions which rely on electrically conductive metallic particles require the particles to be in contact with each other and with the surfaces to be protected from static charge. Since the particles are surrounded by insulating adhesive binder, this may be difficult to achieve. In materials exhibiting antistatic behavior due to ionic conductivity, effective elimination of static charge may be severely affected by low humidity environments. For example, the biomedical electrodes of publication WO 92/10553 and antistatic coatings of European Application EP 399441A are not useful unless sufficient moisture is available.

Surprisingly, the present invention does not use conductive particles derived from metals or carbon nor does it require high humidity levels to exert its capacity for suppressing the build-up of static charges.

Instead, it is believed that the unique properties of materials of the present invention are provided by the use of polymeric microparticles having complexes of polymer electrolytes on the surface of each microparticle.

Complexes of polyethylene oxide (PEO) and lithium salts have been shown to be promising materials as solid state polymer electrolytes. The use of these materials the development of high energy lithium batteries is considered by Gilmour et al in Proc. Electrochemical Society, 89–94, (1989). Lithium salts, like those disclosed in WO 8,303,322, U.S. Pat. No. 4,471,037 and FR 2,568,574, are most commonly used with PEO in polymer electrolytes. Other metal salts such as alkaline earth salts may also enhance electrolytic properties as described in U.S. Pat. No. 5,162,174. Applications for polymer electrolytes have expanded from a focus on energy storage batteries to their use in other areas such as electrochromic displays and addition to molding resins in the production of conductive molded articles.

Disclosures of polymer electrolytes have dealt with their use as films or as additives to other resin matrices which benefit from the ability to conduct electric current. In no case has there been reference to the preparation of microparticles containing ionically conducting species as part of the microparticles. Further, a problem with polymer electrolytes in film form is their poor performance at room temperature.

It is possible to overcome such problems associated with existing antistatic pressure-sensitive adhesive tapes and polymer electrolytes by using compositions of the invention. Polymeric microparticles having polymer electrolytes on the surface of each polymer particle provide antistatic particles which may be incorporated into adhesive compositions.

When coated on suitable substrates and converted into tape format, these adhesives provide antistatic tapes which are extremely effective in dissipating electrostatic charge.

Particulate adhesives are also known in the art, and have been coated on a variety of substrates and used primarily in applications requiring a low level of adhesion, e.g., repositionability. Such spheres and their use in aerosol adhesive systems having repositionable properties are disclosed in U.S. Pat. No. 3,691,140 (Silver). These microparticles are prepared by aqueous suspension polymerization of alkyl acrylate monomers and ionic comonomer, e.g., sodium methacrylate, in the presence of an emulsifier. The use of a water-soluble, substantially oil-insoluble ionic comonomer is critical to preventing coagulation or agglomeration of the microparticles. However, particulate adhesives disclosed in the prior art have all been useful as repositionable adhesives for such applications as Post-It TM brand notes, and other removable items. Pressure-sensitive tapes made with this type of adhesive are likely to be considered unsuitable for use as antistatic tapes due to their ease of removal.

However, it has now been discovered that it is possible to develop a balance of properties whereby surface conductive polymer particles may be formulated into adhesives which possess adhesion which is sufficient for permanent attachment, and low tribocharging characteristics.

SUMMARY OF THE INVENTION

The invention provides conductive, polymeric, inherently tacky, solvent-insoluble, solvent-dispersible, elastomeric, microparticles and compositions containing such polymeric microparticles useful in electrical or electronic applications. The microparticles are obtained as insoluble, crosslinked particles having an average particle size of from about 1 micron to about 250 microns.

Useful polymeric microparticles include acrylate particles; however, preferred microparticles are modified acrylate particles having a surface comprised of chains of an ionically conducting polymer electrolyte, preferably polyethylene oxide. The microparticles may be solid or hollow, as desired.

More specifically, the pressure-sensitive adhesive comprises conductive, polymeric, inherently tacky, solvent-insoluble, solvent-dispersible, elastomeric, microparticles comprising 100 parts monomers, said monomers comprising:
a) from about 70 to about 99 of at least one monomer selected from alkyl (meth)acrylate esters and vinyl esters; and
b) up to about 15 parts by weight of at least one polar monomer, and
from about 0.1 part to about 10 part of a polymer electrolyte based on 100 parts monomer. Preferred microparticles use polyethylene oxide as the polymer electrolyte base polymer to form the surface polyelectrolyte complex.

The invention also provides an anti-static particulate pressure-sensitive adhesive consisting essentially of the conductive, polymeric microparticles.

Particles of the invention are obtained via suspension polymerization such as the following two-step emulsification polymerization process comprising the steps of:
a) forming a water-in-oil emulsion by mixing an aqueous solution of polar monomer(s) and a polymer electrolyte base polymer with oil phase monomer(s), said oil phase monomers being selected from alkyl (meth)acrylate esters and vinyl esters;
b) forming a water-in-oil-in-water emulsion by dispersing the water-in-oil emulsion into an aqueous phase; and
c) initiating polymerization preferably by application of heat or radiation.

Microparticles of the invention may also be prepared by a simpler ("one-step") emulsification process comprising aqueous suspension polymerization of at least one alkyl (meth) acrylate ester monomer or vinyl ester monomer and at least one polar monomer in the presence of at least one polymer electrolyte base polymer and at least one emulsifier which is capable of producing a water-in-oil emulsion inside the droplets, as defined below, which is substantially stable during emulsification and polymerization. Both of these methods produce an aqueous suspension of monomer droplets which upon polymerization become microparticles, the majority of which have interior cavities that, upon drying, become voids.

Another process which is useful forms an oil-in water emulsion and disperses such emulsion into an aqueous phase which comprises at least one alkyl (meth)acrylate ester monomer or vinyl ester monomer and at least one polar monomer in the presence of at least one polymer electrolyte base polymer. An emulsifier which produces the water-in-oil emulsion inside the droplets is not used in this process which forms monomer droplets having no interior cavities, which on polymerization become solid microparticles, rather a suspension stabilizer is used.

As used herein, these terms have the following meanings.

1. The term "polymer electrolyte" means a polymeric species containing electron donating atoms which may be associated with acceptor atoms.
2. The term "polymer electrolyte base polymer" means a polymer which is capable of forming a polymer electrolyte during formation of the microparticle.
3. The term "polymer electrolyte functional unit" means the group containing the electron donating species.
4. The term "microparticle" means a particle having a diameter of from about 1 micrometer to about 250 micrometers.
5. The term "tribocharging" means electrostatic charge generation associated with friction between separable surfaces.
6. The term "droplet" means the liquid stage of the microparticles prior to the completion of polymerization.
7. The term "cavity" means a space within the walls of a droplet or microparticle when still in the suspension or dispersion medium prior to drying, and thus containing whatever medium was used.
8. The term "void" means an empty space completely within the walls of a polymerized microparticle.
9. The term "hollow" means containing at least one void or cavity.
10. The term "solid" means voids or cavity-free.
11. The term alkyl (meth)acrylate means an alkyl acrylate or alkyl methacrylate.

As used herein, all parts, percents, and ratios are by weight, unless specifically stated otherwise.

DETAILED DESCRIPTION OF THE INVENTION

Alkyl acrylate or methacrylate monomers useful in preparing the microparticles and conductive pressure-sensitive adhesives of this invention are those monofunctional unsaturated acrylate or methacrylic esters of non-tertiary alkyl alcohols, the alkyl groups of which have from 4 to about 14 carbon atoms. Such acrylates are oleophilic, water emulsifiable, have limited water solubility, and as homopolymers, generally have glass transition temperatures below about $-20°$ C. Included within this class of monomers are, for example, isooctyl acrylate, 4-methyl-2-pentyl acrylate, 2-methylbutyl acrylate, isoamyl acrylate, sec-butyl acrylate, n-butyl acrylate, 2-ethylhexyl acrylate, isodecyl methacrylate, isononyl acrylate, isodecyl acrylate, and the like, singly or in mixtures.

Preferred acrylates include isooctyl acrylate, isononyl acrylate, isoamyl acrylate, isodecyl acrylate, 2-ethylhexyl acrylate, n-butyl acrylate, sec-butyl acrylate, and mixtures thereof. Acrylate or methacrylate or other vinyl monomers which, as homopolymers, have glass transition temperatures higher than about $-20°$ C., e.g., tert-butyl acrylate, vinyl acetate, and the like, may be utilized in conjunction with one or more of the acrylate or methacrylate monomers provided that the glass transition temperature of the resultant polymer is below about $-20°$ C. When methacrylate monomer is the sole alkyl acrylate utilized, a crosslinking agent, infra, must be included.

Useful vinyl ester monomers are those which form homopolymers having glass transition temperatures below about 10° C. Such esters comprise 1 to 14 carbon atoms, and includes such monomers as vinyl 2-ethylhexanoate, vinyl caprate, vinyl laurate, vinyl pelargonate, vinyl hexanoate, vinyl propionate, vinyl decanoate, vinyl octanoate, and the like.

Polar monomers useful in microparticles of the invention include moderately polar monomers such as N-vinyl-2-pyrrolidone, N-vinyl caprolactam, acrylonitrile, vinyl acrylate, and diallyl phthalate, as well as strongly polar monomers such as acrylic acid, methacrylic acid, itaconic acid, hydroxyalkyl acrylates, cyanoalkyl acrylates, acrylamides, substituted acrylamides. When more than one polar monomer is used, mixtures may include monomers having similar or unlike polarities, e.g., one moderately polar and one strongly polar monomer or two monomers from one group.

The conductive microparticles of this invention and the pressure-sensitive adhesives made therefrom comprise at least about 70 parts by weight of at least one alkyl (meth)acrylate ester or vinyl ester and correspondingly, up to about 30 parts by weight of one or more polar monomers.

Polymer electrolyte base polymers suitable for use in the invention include polyethylene oxide, polyphenylene oxide, polyphenylene sulfide, polyethylene sulfide, polyethyleneimine, polypropylene oxide, polybutylene oxide, polybutylene sulfide, polybutylene imine, and the like. Polyethylene oxide is preferred. Useful amounts of the polymer electrolyte base polymer in microparticles of the invention range from about 0.1 part to about 10 parts, preferably from about 1 part to about 5 parts, based on 100 parts monomer weight.

The conductive properties of the polymeric microparticles may be further enhanced by the addition of ionic salts to adhesive compositions which contain the microparticles. It is believed that the ionic salts become associated with the electron donating groups present in the amorphous polymer domains.

Salts used for this purpose include salts of alkali metals, and alkaline earth metals, including but not limited to, NaI, NaSCN, $BaCF_3So_3$, NaBr, $NaClO_4$, LiCl, $LiNO_3$, $LiCF_3SO_3$, $LiSO_4$, LiOH and KOH. Lithium salts are preferred for the present invention, especially lithium nitrate.

Particulate adhesives of the present invention display dramatically different tribocharging properties than continuous adhesive layers of similar chemical components. For example, when coated on a film substrate, an acrylate-based emulsion adhesive produces a continuous film with a planar surface. Upon application and removal from a planar surface, this adhesive tape will cause generation of charged species on the surface of the adhesive and on the planar surface to which it was attached. The residual charge has a magnitude of up to several thousand volts. However, adhesive tape samples of the current invention, under similar conditions generate almost no charge upon removal from the planar surface.

Without wishing to be bound by theory, it is believed that the improved electrical properties of the adhesive are due to two aspects of its particulate nature; firstly, the particulate prevents full area contact of the adhesive layer with the planar surface. The reduced area of attachment results in a reduction of area of separation when the tape is removed from the planar surface, and thus there is less tendency for charged species to be generated. Secondly, there is a surface layer of conductive species available on each microparticle. The surface layer is provided by materials which facilitate conduction of electrical charge. Provision of the host polymer in spherical form allows increased availability of electron donating polymer chains.

Also, it is possible to exert better control over the length of the chains so as to increase the relative number of amorphous domains. This provides a larger network of conductive sites which allows more efficient conduction of electric current.

Electrical characteristics of pressure-sensitive adhesives of the invention vary from somewhat resistive to significantly conductive materials.

It is possible to use microparticles and pressure-sensitive adhesive tapes of the invention in a variety of applications where transport of electrical current or prevention of electrostatic charge is important.

For instance, permanent particulate adhesive compositions containing particles of the invention can be formulated which show remarkably little susceptibility to tribocharging. In the form of adhesive tapes, these compositions are eminently suitable for masking printed circuit boards, e.g., during wave soldering and other similar applications where protection of sensitive electronic components is essential.

Microparticles may be prepared by various emulsification processes, which are varied depending on whether hollow or solid microparticles are desired. Aqueous suspensions of hollow microparticles may be prepared by a "two-step" emulsification process which first involves forming a water-in-oil emulsion of an aqueous solution of polar monomer(s) in oil phase monomer, i.e., at least one (meth)acrylate or vinyl ester monomer, with a polymer electrolyte base polymer, using an emulsifier having a low hydrophilic-lipophilic balance (HLB) value. Suitable emulsifiers are those having an HLB value below about 7, preferably in the range of about 2 to about 7. Examples of such emulsifiers include sorbitan monooleate, sorbitan trioleate, and ethoxylated oleyl alcohol such as Brij ™ 93, available from Atlas Chemical Industries, Inc.

Thus, in this first step, oil phase monomer(s), polymer electrolyte base polymer, emulsifier, a free radical initiator, and, optionally, a crosslinking monomer or monomers as defined below are combined, and an aqueous solution of all or a portion of the polar monomer(s) is agitated and poured into the oil phase mixture to form a water-in-oil emulsion. The polymer electrolyte base polymer may be added to either the oil phase or the water phase. A thickening agent, e.g., methyl cellulose may also be included in the aqueous phase of the water-in-oil emulsion. In the second step, a water-in-oil-in-water emulsion is formed by dispersing the water-in-oil emulsion of the first step into an aqueous phase containing an emulsifier having an HLB value above about 6. The aqueous phase may also contain any portion of the polar monomer(s) which was not added in step one. Examples of such emulsifiers include ethoxylated sorbitan monooleate, ethoxylated lauryl alcohol, and alkyl sulfates. In both steps, when an emulsifier is utilized, its concentration should be greater than its critical micelle concentration, which is herein defined as the minimum concentration of emulsifier necessary for the formation of micelles, i.e., submicroscopic aggregations of emulsifier molecules. Critical micelle concentration is slightly different for each emulsifier, usable concentrations ranging from about $1.0 \times 10^{-4}$ to about 3.0 moles/liter.

Additional detail concerning the preparation of water-in-oil-in-water emulsions, i.e., multiple emulsions, may be found in various literature references, e.g., *Surfactant Systems: Their Chemistry, Pharmacy, & Biology*, (D. Attwood and A. T. Florence, Chapman & Hall Limited, New York, N.Y., 1983).

The final process step of this method involves the application of heat or radiation to initiate polymerization of the monomers. Useful initiators are those which are normally suitable for free radical polymerization of acrylate or vinyl ester monomers and which are oil-soluble and of very low solubility in water. However, when the polar monomer is N-vinyl pyrrolidone, the use of benzoyl peroxide as the initiator is recommended.

Examples of such initiators include azo compounds, hydroperoxides, peroxides, and the like, and photoinitiators such as benzophenone, benzoin ethyl ether, and 2,2-dimethoxy-2-phenyl acetophenone.

Use of a water-soluble polymerization initiator causes formation of substantial amounts of latex. The extremely small particle size of latex particles renders any significant formation of latex undesirable. The initiator is generally used in an amount ranging from about 0.01 percent up to about 10 percent by weight of the total polymerizable composition, preferably up to about 5 percent.

Aqueous suspensions of hollow conductive microparticles may also by prepared by a "one-step" emulsification process comprising aqueous suspension polymerization of at least one alkyl (meth)acrylate ester monomer or vinyl ester monomer and at least one polar monomer and a polymer electrolyte base polymer in the presence of at least one emulsifier capable of producing a water-in-oil emulsion inside the droplets which is substantially stable during emulsification and polymerization. As in the two-step emulsification process, the emulsifier is utilized in concentrations greater than its critical micelle concentration. In general, high HLB emulsifiers are required, i.e., emulsifiers having an HLB value of at least about 25, will produce stable cavity-containing droplets during the polymerization, and are suitable for use in this one-step process. Examples of such emulsifiers include alkylarylether sulfates such as sodium alkylarylether sulfate, e.g., Triton ™ W/30, available from Rohm and Haas, alkylarylpolyether sulfates such as alkylarylpoly(ethylene oxide) sulfates, preferably those having up to about 4 ethyleneoxy repeat units, and alkyl sulfates such as sodium lauryl sulfate, ammonium lauryl sulfate, triethanolamine lauryl sulfate, and sodium hexadecyl sulfate, alkyl ether sulfates such as ammonium lauryl ether sulfate, and alkylpolyether sulfates such as alkyl poly(ethylene oxide) sulfates, preferably those having up to about 4 ethyleneoxy units. Alkyl sulfates, alkyl ether sulfates, alkylarylether sulfates and mixtures thereof are preferred as they provide a maximum void volume per microparticle for a minimum amount of surfactant. Nonionic emulsifiers, e.g., Siponic ™ Y-500-70 (ethoxylated oleyl alcohol), commercially available from Alcolac, Inc, and Pluronic ™ P103 (a block copolymer of polypropylene oxide and polyethylene oxide commercially from BASF Corporation) can be utilized alone or in conjunction with anionic emulsifiers. Polymeric stabilizers may also be present but are not necessary.

The composition may also contain a crosslinking agent such as a multifunctional (meth)acrylate, e.g., butanediol diacrylate or hexanediol diacrylate, or other multifunctional crosslinker such as divinylbenzene. When used, crosslinker(s) is (are) added at a level of up to about 1 percent, preferably up to about 0.5 percent, of the total polymerizable composition.

Solid microparticles of the invention may be made by a similar one-step process comprising aqueous suspension polymerization of at least one alkyl (meth)acrylate ester monomer or vinyl ester monomer, at least one polar monomer and a polymer electrolyte base polymer in the presence of an suspension stabilizer. It is not necessary to use a high HLB emulsifier because the droplets formed need not be cavity-containing droplets. Examples of such useful lower HLB emulsifiers include ammonium lauryl sulfate such as Standapol ™ A, available from Hercules and other steric or electrosteric polymeric stabilizers such as (poly)vinyl alcohol, polyacrylic acid, polymethacrylic acid, polyacrylamide, polyvinyl pyrrolidone, polyvinyl methylether, and the like.

Preparation of microspheres of the invention may be modified by withholding the addition or all or part of the polymer electrolyte base polymer, and polar monomers until after polymerization of the oil phase is initiated; however, the components must be added to the polymerizing mixture prior to 100% polymer conversion.

Discrete conductive polymeric microparticles may also be prepared via suspension polymerizations disclosed in U.S. Pat. Nos. 3,691,140, 4,166,152, 4,636,432, 4,656,218, and 5,045,569, for preparing adhesive compositions.

The conductive microparticles of the invention are normally tacky, elastomeric, insoluble but swellable in organic solvents, and small, typically having diameters of at least about 1 micrometer, preferably in the range of about 1 to about 250 micrometers, more preferably from about 1 to about 50 micrometers. They may be solid or contain a single void, or multiple voids.

Following polymerization, an aqueous suspension of the microparticles is obtained which is stable to agglomeration or coagulation under room temperature conditions. The suspension may have non-volatile solids contents of from about 10 to about 50 percent by weight. Upon prolonged standing, the suspension separates into two phases, one phase being aqueous and substantially free of polymer, the other phase being an aqueous suspension of conductive microparticles. Where high HLB emulsifiers are used the droplets have one or more cavities which, upon drying, become voids. Both phases may contain a minor portion of small latex particles. Decantation of the microparticle-rich phase provides an aqueous suspension having a non-volatile solids content on the order of about 40–50 percent which, if shaken with water, will readily redisperse.

If desired, the aqueous suspension of conductive microparticles may be utilized immediately following polymerization to provide inherently tacky pressure-sensitive adhesive coatings having low tribocharging characteristics, or "antistatic" adhesives.

Tapes which are useful in applications of this type may be produced by coating microparticle containing compositions of the invention onto a variety of substrates. Suitable substrates include polymeric films such as polyimide, polyethylene terephthalate, polyphenylene sulfide, polypropylene, cellulose acetate, ethyl cellulose; paper, woven or nonwoven fabric formed of synthetic or natural materials, metallized polymeric film, ceramic sheet material, metal foils, etc. Primer or binders may be used, but they are not required. The coating may be carried out by conventional methods such as knife coating, Meyer bar coating, and other conventional means known in the art for coating adhesives such as use of an extrusion die.

The tape may be commercialized in roll form, or may be divided into segments for sale, such as strips or labels. Additionally, the adhesive may be provided between two substrates, e.g., the adhesive is coated onto a paper substrate, which can be used as a label, which may be provided on a low adhesion backsize or other easily removable surface for individual use.

The adhesion properties of the microparticles may be altered by addition of tackifying resin and/or plasticizer. Preferred tackifiers for use herein include hydrogenated rosin esters commercially available from companies such as Hercules Inc., under such trade names as Foral TM 65, Foral TM 85, and Foral TM 105. Other useful tackifiers include those based on t-butyl styrene. Useful plasticizers include dioctyl phthalate, 2-ethyl hexyl phosphate, tricresyl phosphate, and the like.

It is also within the scope of this invention to include various other components to tapes of the invention, such as pigments, fillers, including additional conductive fillers, stabilizers, or various polymeric additives.

These and other aspects of the invention are illustrated by the following examples which should not be viewed as limiting in scope.

Test Methods

Resistivity Measurements of Antistatic Coatings

Resistivity is a measure of the intrinsic ability of a material to conduct electrons. It is a property which is independent of the dimensions of the material sample.

The surface resistivity of coatings of the invention was measured by connecting a Keithley 616 digital electrometer (Keithley 6105 resistivity adapter) to a 500 volt power supply, and attaching to an electrometer. Individual samples were measured using standard procedures according to ASTM D-257.

Peel Adhesion

Peel adhesion is the force required to remove a coated flexible sheet material from a test panel measured at a specific angle and rate of removal. In the examples, this force is expressed in grams per centimeter (cm) width of coated sheet. The procedure followed is: A strip 1.27 cm in width of the coated sheet is applied to the horizontal surface of a clean glass test plate with at least 12.7 lineal cm in firm contact. A 2 kg hard rubber roller is used to apply the strip. The free end of the coated strip is doubled back nearly touching itself so the angle of removal will be 180°. The free end is attached to the adhesion tester scale. The steel test plate is clamped in the jaws of a tensile testing machine which is capable of moving the plate away from the scale at a constant rate of 2.3 meters per minute. The scale reading in grams is recorded as the tape is peeled from the steel surface. The data is reported as the average of the range of numbers observed during the test.

| | Glossary |
|---|---|
| IOA | Isooctyl Acrylate |
| AA | Acrylic Acid |
| PEO | Polyethylene Oxide Acrylate |
| PEO (750) | Acrylate terminated PEO having a MW of about 750) |
| BPER | 70% Benzoyl Peroxide, Lucidol TM 70 |
| PEODMA | Polyethylene oxide Dimethacrylate [(PEO)$_9$DMA] |
| 1,6 HDDA | 1,6 Hexanediol Diacrylate |
| ALS | Ammonium Lauryl Sulfate, |
| Standapol TM A | Ammonium Lauryl Sulfate from Hercules |

EXAMPLES

Preparations of Microparticles

Example 1

Acrylic acid (5.4 g), polyethylene oxide acrylate (PEO 750) (13.5 g), PEODMA (0.15 g) and 70% benzoyl peroxide (0.99 g) were dissolved in isooctyl acrylate (223.2 g). This solution was added to an aqueous solution of surfactant. The surfactant solution comprised Standapol TM A, available from Hercules, (8.4 g) dissolved in de-ionized water (360 g). An emulsion of the isooctyl acrylate solution in the aqueous solution was produced by high shear mixing using an Omni mixer at setting 5. Mixing was continued until the average particle size of the oily droplets was approximately 3 μm. Size was determined using an optical microscope.

The resulting oil-in-water emulsion was charged to a 1-liter resin reactor equipped with four baffles, a paddle stirrer and a suitable heat source, such as a heating mantle. With continuous stirring at a rate of 400 rpm, the reactor and contents were heated to 60° C.

At this point the reactor was degassed with nitrogen. A reaction proceeded in the absence of oxygen. This was allowed to continue for a period of 22 hours while both temperature and stirring rate were maintained. The resulting aqueous suspension contained insoluble particles of approximately 5 μm in diameter.

Examples 2–6

The particle suspensions for Examples 2–6 were prepared as described for Example 1, with changes in materials' concentration as indicated in Table 1.

TABLE 1

| | | | | Material Concentration IOA/AA/PEO RATIO | | | | |
|---|---|---|---|---|---|---|---|---|
| EXAMPLE | IOA | AA | PEO | BPER | PEODMA | 1,6 HDDA | DI WATER | Standapol TM A |
| 1 | 223.2 g | 5.4 g | 13.5 g | 0.99 g | 0.15 g | — | 360 g | 8.4 g |
| 93/02/05 | 36.49% | 0.88% | 2.20% | 0.16% | 0.02% | | 58.86% | 1.37% |
| 2 | 189 g | 6.3 g | 14.7 g | 0.99 g | 0.15 g | — | 390 g | 8.6 g |
| 90/03/07 | 31.00% | 1.03% | 2.41% | 0.16% | 0.02% | | 64.0% | 1.41% |
| 3 | 294 g | 6.0 g | — | 1.42 g | — | 6.0 g | 300 g | 10 g |
| 98/02 | 47.62% | 0.97% | | 0.23% | | 0.97% | 48.59% | 1.62% |
| 4 | 228 g | 2.4 g | 9.6 g | 1.13 g | — | — | 360 g | 4.0 g |
| 95/01/04 | 37.68% | 0.40% | 1.59% | 0.19% | | | 59.49% | 0.66% |
| 5 | 230 g | 2.4 g | 7.2 g | 1.13 g | — | — | 360 g | 4.0 g |
| 96/01/03 | 38.07% | 0.40% | 1.19% | 0.19% | | | 59.49% | 0.66% |
| 6 | 228.0 g | 4.8 g | 7.2 g | 1.12 g | — | | 360 g | 3.84 g |

TABLE 1-continued

| EXAMPLE | Material Concentration IOA/AA/PEO RATIO | | | | | | | |
|---|---|---|---|---|---|---|---|---|
| | IOA | AA | PEO | BPER | PEODMA | 1,6 HDDA | DI WATER | Standapol TM A |
| 95/02/03 | 37.69% | 0.79% | 1.19% | 0.19% | | | 59.5% | 0.63% |

Preparation of Coating Composition

TABLE 2

| Material | Amount (phr) |
|---|---|
| Microparticle Adhesive | 100.0 |
| Lithium Nitrate | 0.30 |
| Lithium Hydroxide | 0.23 |
| Ammonium Hydroxide | 0.50 |
| De-ionized Water | 3.8 |
| Polyphobe 104 TM | 0.5 |

[NOTE: UCAR Polyphobe 104 TM an acrylic latex thickener available from Union Carbide.]

Lithium nitrate was dissolved in sufficient de-ionized water to provide a 20% solution of the lithium salt. In similar fashion a 10% aqueous solution of lithium hydroxide was prepared.

These solutions were added separately with slow stirring to a mixture of the microparticle adhesive prepared according to Example 1, to which Polyphobe TM 104 had previously been added, the mixture being contained in a stainless steel vessel.

Finally, the ammonium hydroxide was slowly stirred into the adhesive mixture to adjust the pH to between 8 and 10. This adhesive microparticle electrolyte suspension was coated 100 micrometers (4 mils) thick on primed poly(ethylene terephthalate) film and dried for 7 mins. at 220° F.

Comparison of Properties to Conventional Adhesives

Adhesive tapes of the invention, coated on cellulose acetate, were compared with Scotch brand Magic TM Tape and Scotch brand Post-It TM Tape, both of which are available from Minnesota Mining and Manufacturing Company (3M). Properties measured include surface resistivity, tribocharging upon roll unwind and tribocharging upon removal of tape from a printed circuit board, all of which were measured at 68% relative humidity. Results shown in Table 3 clearly show that Post-It TM Tape exhibits less tribocharging, nevertheless the tribocharging is still significantly greater than tribocharge levels generated with tapes of the invention. Table 4 shows the peel strength of the various adhesive tapes.

TABLE 3

| | Electrical Properties of Adhesive Tapes | | | |
|---|---|---|---|---|
| Adhesive Tape | Resistivity Ohms/square | Tribocharging (Volts) | | |
| | | Unwind[a] | Board[b] | Tape[c] |
| #810 Magic Tape | $1.0 \times 10^{14}$ | 12,000 | 950 | 2,400 |
| #811 Post-It | $5.0 \times 10^{11}$ | 270 | 943 | 53 |
| Example 6 | $6.0 \times 10^{9}$ | 20 | 10 | 1 |

[a]Unwind = Voltage on the surface of freshly unwound tape.
[b]Board = Voltage on the surface of a printed circuit board after removal of adhesive tape.
[c]Tape = Voltage on the surface of the tape which was removed from the printed circuit board

TABLE 4

| TAPE SAMPLE | ADHESION TO STEEL (OZ/IN) | UNWIND (OZ/IN) |
|---|---|---|
| 3M Brand Magic Tape #810 | 24.00 | 6.0 |
| 3M Brand Magic Tape #811 | 2.3 | — |
| Example 6 | 24.00 | 14.00 |

Varying amounts of lithium nitrate were added to a coating composition formulated as in Table 2, using the composition of Example 6. The relative amounts of polyethylene oxide per lithium nitrate are shown in Table 5. There is clear evidence of the effect of the metal salts and varying molar ratios on amounts of tribocharging and surface resistivity characteristics.

TABLE 5

| Ex. # | Molar Ratio EO/Li | Resistivity Ω/sq | | Tribocharging (Volts) 10% RH |
|---|---|---|---|---|
| | | 70% RH | 10% RH | |
| 1 | 1.32 | $2.0 \times 10^{3}$ | $1.1 \times 10^{7}$ | 0 |
| 2 | 1.98 | $9.5 \times 10^{5}$ | $1.4 \times 10^{8}$ | 5 |
| 3 | 3.96 | $5.7 \times 10^{6}$ | $2.2 \times 10^{9}$ | 10 |
| 4 | 5.28 | $1.0 \times 10^{7}$ | $3.4 \times 10^{9}$ | 66 |
| 5 | 7.92 | $2.4 \times 10^{7}$ | $1.8 \times 10^{10}$ | 345 |
| 6 | 10.56 | $5.9 \times 10^{7}$ | $3.3 \times 10^{10}$ | 642 |
| 7 | 15.84 | $1.3 \times 10^{8}$ | $1.3 \times 10^{11}$ | 1930 |

Effect of Lithium Salt and Particle Size Variation

Changes in the electrical properties of surface resistivity and tribocharging are related to variation in either the size of the microparticles or the addition of lithium salts as shown in Table 6.

The level of relative humidity is also important, however, even at low humidity levels it is shown that optimization of particle size and lithium salt content produces antistatic adhesive coatings with tribocharging levels approaching zero.

TABLE 6

| Ex. # | Size μm | Resistivity Ω/sq | | Tribocharging (Volts) 10% RH |
|---|---|---|---|---|
| | | 70% RH | 10% RH | |
| 1* | 3–5 | $7.4 \times 10^{6}$ | $4.8 \times 10^{9}$ | 101 |
| 2 | 3–5 | $1.9 \times 10^{11}$ | $4.7 \times 10^{12}$ | >2,000 |
| 3* | 15 | $1.3 \times 10^{7}$ | $2.3 \times 10^{9}$ | 88 |
| 4 | 15 | $6.1 \times 10^{10}$ | $8.3 \times 10^{11}$ | 1500 |
| 5* | 35 | $4.3 \times 10^{7}$ | $6.2 \times 10^{9}$ | 103 |
| 6 | 35 | $2.0 \times 10^{10}$ | $6.8 \times 10^{11}$ | >2,000 |
| 7* | 71 | $6.1 \times 10^{7}$ | $1.9 \times 10^{10}$ | 225 |
| 8 | 71 | $3.1 \times 10^{11}$ | $2.0 \times 10^{13}$ | >2,000 |

NOTE
(*) designates samples containing lithium salts.

What is claimed is:

1. Conductive, polymeric, inherently tacky, solvent insoluble, solvent-dispersible, elastomeric, pressure-sensitive adhesive microparticles having an average diameter of at least about 1 micrometer, wherein said microparticles have a surface further comprising an ionic conductive material, said material having been formed from a polymer electrolyte base polymer, and at least one ionic salt selected from the group consisting of salts of alkali metals and salts of alkaline earth metals.

2. Conductive, polymeric, inherently tacky, solvent-insoluble, solvent-dispersible, elastomeric, pressure-sensitive adhesive microparticles according to claim 1 comprising a polymer of monomers comprising:
a) at least about 70 parts of at least one alkyl (meth)acrylate or vinyl ester,
b) correspondingly, up to about 30 parts of at least one polar monomer, to make 100 parts monomer, and wherein said ionic conductive material comprises a polymer electrolyte formed from a polymer electrolyte base polymer, said polymer electrolyte base polymer added in an amount of from about 0.1 part to about 10 parts.

3. The conductive microparticles of claim 1 wherein said ionic conductive material is formed from a polymer electrolyte base polymer selected from the group consisting of polyethylene oxide, polyphenylene oxide, polyphenylene sulfide, polyethylene sulfide, polyethyleneimine, polypropylene oxide, polybutylene oxide, polybutylene sulfide, and polybutylene imine.

4. The conductive, polymeric, inherently tacky, solvent-insoluble, solvent-dispersible, elastomeric, pressure-sensitive adhesive microparticles of claim 1 wherein said ionic conductive material further comprises from about 0.01 moles to about 10 moles of at least one salt of an alkali metal or alkaline earth metal per mole of polymer electrolyte base polymer.

5. The conductive, polymeric, inherently tacky, solvent-insoluble, solvent-dispersible, elastomeric, pressure-sensitive adhesive microparticles of claim 4 wherein said salt is selected from the group consisting of LiCl, LiNO$_3$, LiCF$_3$SO$_3$, LiSO$_4$, LiOH, KOH, NaSCN, NaI, BaSO$_3$CF$_3$, and NH$_4$OH.

6. Conductive, polymeric, inherently tacky, solvent-insoluble, solvent-dispersible, elastomeric, pressure-sensitive adhesive microparticles according to claim 2 wherein said monomer comprises:
a) at least about 85 parts by weight of at least one alkyl (meth)acrylate or vinyl ester, and
b) correspondingly, up to about 15 parts by weight of at least one polar monomer, to make 100 parts monomer,
wherein said ionic conductive material comprises a polymer electrolyte material formed from about 0.1 part to about 10 parts of said polymer electrolyte base polymer.

7. The conductive microparticles of claim 6 wherein the alkyl (meth)acrylate is selected from the group consisting of isooctyl (meth)acrylate, 2-ethylhexyl (meth)acrylate, isononyl (meth)acrylate, isoamyl (meth)acrylate, isodecyl (meth)acrylate, and butyl (meth)acrylate.

8. The conductive particles of claim 6 wherein the vinyl ester is selected from the group consisting of vinyl 2-ethylhexanoate, vinyl caproate, vinyl laurate, vinyl pelargonate, vinyl hexanoate, vinyl propionate, vinyl decanoate, and vinyl octanoate.

9. The conductive microparticles of claim 6 wherein said polar monomer is selected from the group consisting of N-vinyl-2-pyrrolidone, N-vinyl caprolactam, acrylonitrile, vinyl acrylate, diallyl phthalate, acrylic acid, methacrylic acid, itaconic acid, hydroxyalkyl acrylates, cyanoalkyl acrylates, acrylamides, and substituted acrylamides.

10. The conductive, polymeric, inherently tacky, solvent-insoluble, solvent-dispersible, elastomeric, pressure-sensitive adhesive microparticles of claim 1 wherein said microparticles have a surface and at least one inner void, and have an average diameter of from about 1 micrometer to about 250 micrometers.

11. An anti-static particulate pressure-sensitive adhesive comprising the conductive, polymeric, inherently tacky, solvent-insoluble, solvent-dispersible, elastomeric, pressure-sensitive adhesive microparticles of claim 1.

12. An anti-static particulate pressure-sensitive adhesive comprising the conductive, polymeric, pressure-sensitive adhesive microparticles of claim 2.

13. An anti-static particulate pressure-sensitive adhesive comprising the conductive, polymeric, pressure-sensitive adhesive microparticles of claim 3.

14. An anti-static particulate pressure-sensitive adhesive according to claim 12 wherein the polymer electrolyte base polymer is polyethylene oxide.

15. An anti-static pressure-sensitive adhesive tape comprising a substrate having coated on at least one major surface thereof the conductive microparticles of claim 1.

16. An anti-static pressure-sensitive adhesive tape comprising a substrate having coated on at least one major surface thereof the pressure-sensitive adhesive of claim 11.

17. An anti-static pressure-sensitive adhesive tape comprising a substrate having coated on at least one major surface thereof the pressure-sensitive adhesive of claim 12.

18. An antistatic pressure-sensitive adhesive tape according to claim 17 wherein said tape has a surface which will accept printing.

19. An antistatic pressure-sensitive adhesive label having coated on at least one major surface thereof a pressure-sensitive adhesive according to claim 11.

20. An antistatic pressure-sensitive adhesive label having coated on at least one major surface thereof a pressure-sensitive adhesive according to claim 12.

* * * * *